(12) United States Patent
Tanaka

(10) Patent No.: US 11,158,841 B2
(45) Date of Patent: Oct. 26, 2021

(54) METHOD FOR MANUFACTURING ORGANIC EL DISPLAY DEVICE

(71) Applicant: HON HAI PRECISION INDUSTRY CO., LTD., New Taipei (TW)

(72) Inventor: Kohichi Tanaka, Osaka (JP)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 17 days.

(21) Appl. No.: 16/066,590

(22) PCT Filed: Jul. 22, 2016

(86) PCT No.: PCT/JP2016/071574
§ 371 (c)(1),
(2) Date: Jun. 27, 2018

(87) PCT Pub. No.: WO2017/115484
PCT Pub. Date: Jul. 6, 2017

(65) Prior Publication Data
US 2019/0044096 A1 Feb. 7, 2019

(30) Foreign Application Priority Data
Dec. 28, 2015 (JP) .............................. JP2015-256464

(51) Int. Cl.
*G03C 8/00* (2006.01)
*H01L 51/56* (2006.01)
(Continued)

(52) U.S. Cl.
CPC .............. *H01L 51/56* (2013.01); *B23K 26/36* (2013.01); *G09F 9/30* (2013.01); *H01L 27/3209* (2013.01);
(Continued)

(58) Field of Classification Search
CPC . H01L 51/56; H01L 51/0013; H01L 27/3244; H01L 27/3246; H01L 2227/323; H01L 27/32; H01L 51/003
See application file for complete search history.

(56) References Cited

U.S. PATENT DOCUMENTS 7,199,516 B2 * 4/2007 Seo ...................... H01L 27/3246
313/504
7,923,284 B2 * 4/2011 Lee ...................... H01L 51/0021
257/E21.024

(Continued)

FOREIGN PATENT DOCUMENTS

| JP | 2003-103337 A | 6/2003 |
| JP | 2011-048374 A | 3/2011 |
| JP | 2014-048619 A | 3/2014 |

*Primary Examiner* — Bradley Smith
*Assistant Examiner* — David J Goodwin
(74) *Attorney, Agent, or Firm* — ScienBiziP, P.C.

(57) ABSTRACT

A method for producing an organic EL display device in an embodiment includes step (a) of forming a polymer film (14) on a support substrate (12); step (b) of forming a plurality of organic EL display panel portions (20) on the polymer film (14); and step (c) of causing the organic EL display panel portions (20) on a stage (200S) to face the stage (200S), and directing a line beam (100L) in a direction from the support substrate (12) toward at least an interface between the polymer film (14) and the support substrate (12) while moving the line beam (100L) and the support substrate (12) with respect to each other, the step (c) being performed in a state where the organic EL display panel portions (20) are substantially thermally insulated from the stage (200S).

4 Claims, 13 Drawing Sheets

(51) Int. Cl.

| | |
|---|---|
| *H01L 51/00* | (2006.01) |
| *B23K 26/36* | (2014.01) |
| *G09F 9/30* | (2006.01) |
| *H05B 33/10* | (2006.01) |
| *H01L 27/32* | (2006.01) |
| *H01L 51/50* | (2006.01) |
| *H05B 33/04* | (2006.01) |

(52) U.S. Cl.
 CPC ........ *H01L 51/003* (2013.01); *H01L 51/5012* (2013.01); *H05B 33/04* (2013.01); *H05B 33/10* (2013.01); *H01L 2251/5338* (2013.01)

(56) References Cited

U.S. PATENT DOCUMENTS

| | | | | |
|---|---|---|---|---|
| 9,099,686 | B2* | 8/2015 | Kim | .................... H01L 51/0013 |
| 9,130,194 | B2* | 9/2015 | Lee | .................... H01L 51/5271 |
| 9,360,748 | B2* | 6/2016 | Lee | .......................... B41M 5/46 |
| 9,437,822 | B2* | 9/2016 | Lin | ...................... H01L 51/0017 |
| 2003/0064569 | A1 | 4/2003 | Takayama et al. | |
| 2005/0282357 | A1 | 12/2005 | Takayama et al. | |
| 2006/0243377 | A1* | 11/2006 | Matsuo | ...................... B44C 1/17 |
| | | | | 156/235 |
| 2009/0095962 | A1* | 4/2009 | Matsunobu | .......... B23K 26/032 |
| | | | | 257/88 |
| 2009/0194220 | A1* | 8/2009 | Yoo | ...................... H01L 51/0013 |
| | | | | 156/67 |
| 2009/0256169 | A1* | 10/2009 | Yokoyama | .......... H01L 51/0096 |
| | | | | 257/98 |
| 2009/0266479 | A1* | 10/2009 | Chung | .................... B32B 33/00 |
| | | | | 156/247 |
| 2013/0011969 | A1 | 1/2013 | Chen et al. | |
| 2014/0050933 | A1 | 2/2014 | Kim et al. | |
| 2014/0147577 | A1* | 5/2014 | Lee | .......................... H01L 51/56 |
| | | | | 427/8 |
| 2016/0035978 | A1* | 2/2016 | Lin | ...................... H01L 27/3244 |
| | | | | 257/88 |

\* cited by examiner (a)

(b)

METHOD FOR MANUFACTURING ORGANIC EL DISPLAY DEVICE

TECHNICAL FIELD

The present invention relates to a method for producing an organic EL display device, specifically, a method for producing a flexible organic EL display device.

BACKGROUND ART

Organic EL (Electro-Luminescence) display devices have now started to be provided as practically usable devices. One feature of such an organic EL display device is that the display device is flexible. An organic EL display device includes, in each of pixels, at least one OLED (Organic Light-Emitting Diode) and at least one TFT (Thin Film Transistor) controlling an electric current to be supplied to each such OLED. Hereinafter, an organic EL display device will be referred to as an "OLED display device". An OLED display device including a switching element such as a TFT or the like for each of OLEDs as described above is referred to as an "active matrix OLED display device".

For a substrate of a flexible OLED display device, studies have been made on a plastic substrate, a metal foil, a polymer film and the like. In order to provide display performance of substantially the same level as that of a liquid crystal display device, the flexible OLED display device needs to include the above-described TFT formed therein. A heat-resistant polymer film (e.g., polyimide film) is used as an element withstanding a high temperature process in a step of forming the TFT. However, from the point of view of size accuracy or the like, it is very difficult to form a TFT or an OLED on a flexible polymer film used as the substrate. Therefore, today, a flexible OLED display panel is produced as follows. A polymer film is formed on a support substrate (typically, glass substrate), display panel portions each including a TFT and an OLED are formed on the polymer film on the support substrate, and then the polymer film is delaminated from the support substrate to produce the flexible OLED display panel. After this, a driving circuit or the like is mounted on the OLED display panel to produce a flexible OLED display device.

As a method for delaminating the polymer film from the support substrate, a laser lift-off (LLO) method has been studied (e.g., Patent Documents 1 and 2). According to the LLO method, high-output pulsed laser light emitted from an excimer laser or a YAG laser is collected and directed toward an interface between the polymer film and the support substrate and so as to irradiate the interface with to physically or chemically change the polymer film, so that the polymer film is delaminated from the support substrate. The pulsed laser light is shaped into a light beam having a cross-section that is lengthy and extends like a line. Such a line-like light beam is referred to as a "line beam". The shape of the line beam at a surface irradiated with the line beam, namely, a light irradiation region, is a rectangle having, for example, a length in a longer axis direction of 350 mm and a length in a shorter axis direction of 1 mm or shorter. The line beam may be moved in the shorter axis direction with respect to the support substrate, so that the polymer film is continuously delaminated from the entirety of the support substrate.

However, it is not easy to delaminate the polymer film uniformly from the entirety of the support substrate. According to the method described in Patent Document 1, a surface remaining film containing a metal material or a metal oxide is formed on a surface of the polymer film opposite to the surface on which the display panel portions are formed. The surface remaining film and the support substrate, or the surface remaining film and the polymer film, are delaminated from each other.

Patent Document 2 describes that in the case where the film is delaminated from the entirety of the support substrate as described in Patent Document 1, a post-delamination step needs to be performed in a state where the polymer film includes a portion that is not used as the flexible display panel, which is troublesome. According to the method disclosed in Patent Document 2, a delamination preventive layer is formed at a predetermined position, so that only a portion that is used as the flexible display panel is selectively delaminated.

CITATION LIST

Patent Literature

Patent Document No. 1: Japanese Laid-Open Patent Publication No. 2011-48374
Patent Document No. 2: Japanese Laid-Open Patent Publication No. 2014-48619

SUMMARY OF INVENTION

Technical Problem

However, the methods described in Patent Documents 1 and 2 both require an extra layer for the delamination step performed by the LLO method (the surface remaining film or the delamination preventive layer), which raises the cost.

The present invention has a main object of providing a method for producing a flexible OLED display device at lower cost than the conventional methods.

Solution to Problem

A method for producing an organic EL display device in an embodiment according to the present invention includes step (a) of forming a polymer film on a support substrate; step (b) of forming a plurality of organic EL display panel portions on the polymer film; and step (c) of causing the plurality of organic EL display panel portions on a stage to face the stage, and directing a line beam in a direction from the support substrate toward at least an interface between the polymer film and the support substrate while moving the line beam and the support substrate with respect to each other, the step (c) being performed in a state where the plurality of organic EL display panel portions are substantially thermally insulated from the stage.

In an embodiment, the step (c) is performed in a state where the plurality of organic EL display panel portions are out of contact with the stage.

In an embodiment, the step of forming the plurality of organic EL display panel portions includes a step of forming a plurality of organic EL display panel portions arrayed in at least one line; and the method further includes, before the step (c), a step of mounting a driving circuit on the plurality of organic EL display panel portions arrayed in the at least one line.

In an embodiment, in the step (c), the state where the plurality of organic EL display panel portions are out of contact with the stage is maintained by a spacer member provided between the stage and a region, in the support substrate, between the plurality of organic EL display panel portions.

A method for producing an organic EL display device in another embodiment according to the present invention includes step (a) of forming a polymer film on a support substrate; step (b) of forming a plurality of organic EL display panel portions on the polymer film; and step (c) of causing the plurality of organic EL display panel portions on a stage to face the stage, and collecting and directing a line beam in a direction from the support substrate toward at least an interface between the polymer film and the support substrate while moving the line beam and the support substrate with respect to each other, the step (c) being performed in a state where a heat releasing rate from the interface between the polymer film and the support substrate to the plurality of organic EL display panel portions and a heat releasing rate from the interface between the polymer film and the support substrate to a gap between the plurality of organic EL display panel portions are substantially equal to each other.

In an embodiment, the step (c) is performed in a state where the stage is heated.

Advantageous Effects of Invention

An embodiment according to the present invention provides a method for producing a flexible OLED display device at lower cost than the conventional methods.

DESCRIPTION OF EMBODIMENTS

Figure 1:
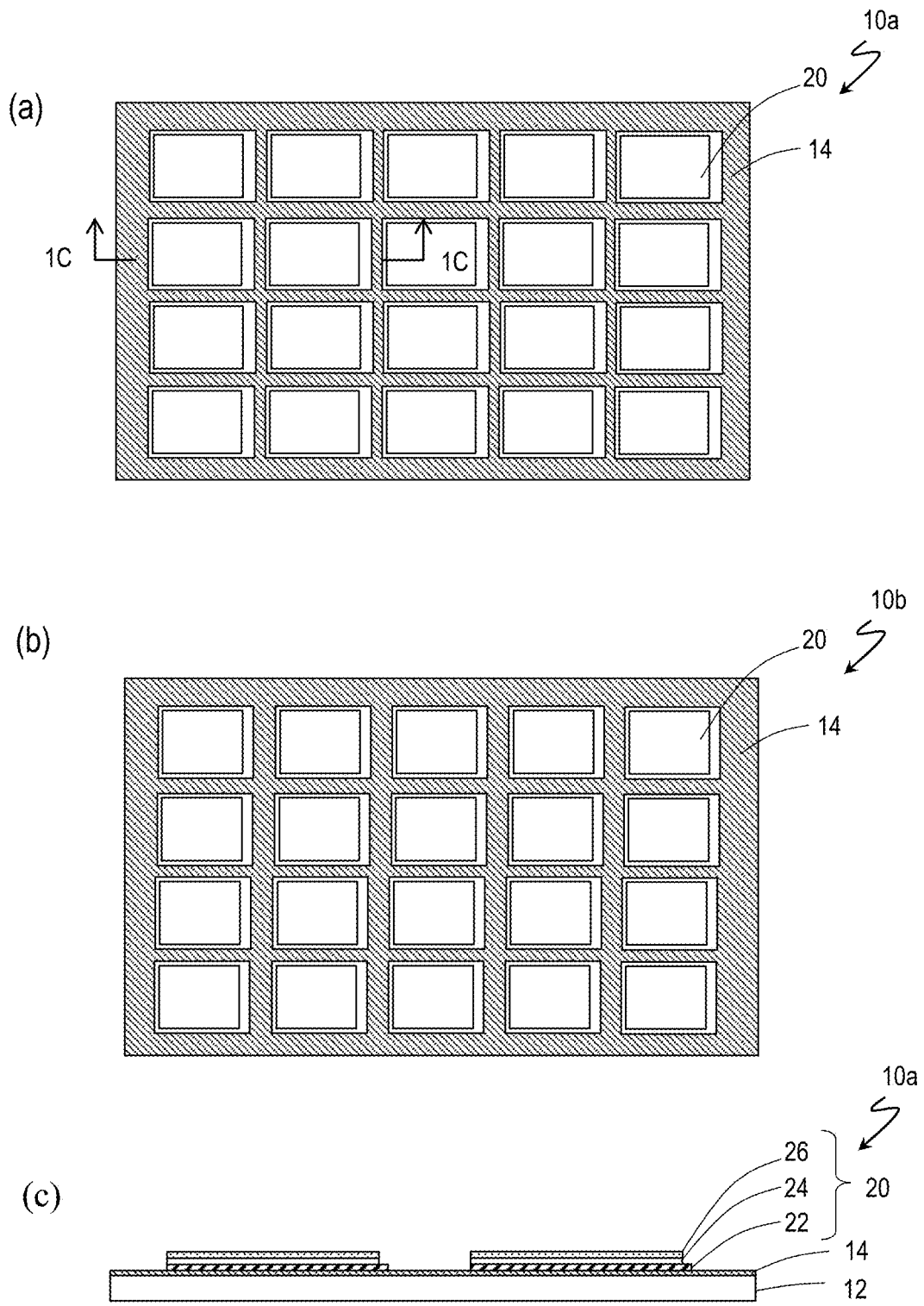
FIG. 1(a) and FIG. 1(b) are respectively schematic plan views of multi-portion panel substrates 10a and 10b provided during a process of producing an OLED display device in an embodiment according to the present invention.
FIG. 1(c) is a schematic cross-sectional view taken along line 1C-1C in FIG. 1(a).

Hereinafter, a method for producing an OLED display device in an embodiment according to the present invention will be described with reference to the drawings. FIG. 1(a) and FIG. 1(b) are respectively schematic plan views of multi-portion panel substrates 10a and 10b, which are provided during a process for producing an OLED display device in an embodiment according to the present invention. FIG. 1(c) is a schematic cross-sectional view taken along line 1C-1C in FIG. 1(a).

As shown in FIG. 1(c), a plurality of OLED display panel portions 20 are formed on a heat-resistant polymer film 14 formed on a support substrate 12. In the example described below, the support substrate 12 is a glass substrate 12, and the heat-resistant polymer film 14 is a polyimide (aromatic polyimide) film 14. In general, the support substrate 12 merely needs to sufficiently transmit light usable to delaminate the heat-resistant polymer film 14 and to have stable heat resistance and mechanical characteristics (including size stability). It is preferred that the heat-resistant polymer film 14 is formed of polyimide from the points of view of flexibility, mechanical strength, heat resistance, chemical resistance and the like. The heat-resistant polymer film 14 is not limited to being formed of polyimide. It should be noted that the characteristics of a semiconductor layer to be used in the OLED display panel portions 20 tend to be higher as the deposition temperature of the semiconductor layer, the growth temperature of the semiconductor layer, or the annealing temperature of the semiconductor layer once deposited is higher. Therefore, it is desirable that the heat-resistant polymer film 14 has a heat resistance with which the semiconductor layer may be heated to, for example, a temperature higher than 400° C., preferably to 450° C. or higher. The polyimide film 14 has a thickness of, for example, 10 μm to 30 μm.

As shown in FIG. 1(a), the plurality of OLED display panel portions 20 are arrayed in a matrix including a plurality of rows and a plurality of columns. The directions of the rows and the columns are arbitrary. In this example, the lateral direction (longer side direction of the substrate) is the row direction, and the vertical direction (shorter side direction of the substrate) is the column direction.

The pitch of the OLED display panel portions 20 is arbitrarily set, and may be appropriately set in accordance with the size of the panel substrate 10a and the size of the OLED display panel portions 20. For example, as in the panel substrate 10b shown in FIG. 1(b), gaps between the OLED display panel portions 20 adjacent to each other in the row direction may be longer than in the panel substrate 10a shown in FIG. 1(a). For example, the panel substrate 10b shown in FIG. 1(b) may be delaminated after, for example, a driving circuit is mounted thereon as described below.

As schematically shown in FIG. 1(c), the OLED display panel portions 20 each include an element layer 22 including a TFT, an OLED and the like formed therein, a barrier layer 24 formed on the element layer 22, and a sealing film 26 formed on the barrier layer 24. The OLED display panel portions 20 may have any of a wide variety of known structures. The element layer 22 has a thickness of, for example, 2 µm to 5 µm. The barrier layer 24 is formed of, for example, a silicon nitride-based insulating layer or an organic layer, or may include a multi-layer structure including the silicon nitride-based insulating layer and the organic layer. The barrier layer 24 has a thickness of, for example, 2 µm to 20 µm. The sealing film 26 is formed of, for example, PEN (polyethylene naphthalate) or PET (polyethylene terephthalate). The sealing film 26 has a thickness of, for example, 20 µm to 100 µm. An example of structure of the OLED display panel portions 20 will be described below briefly with reference to FIG. 14.

As described below, the OLED display panel portions 20 are delaminated, together with the polyimide film 14, from the glass substrate 12 and divided to become, for example, an OLED display panel 10A shown in FIG. 2(a). When necessary, a driving circuit (e.g., driver IC) is mounted on the OLED display panel 10A, so that an OLED display module is provided.

Figure 2:
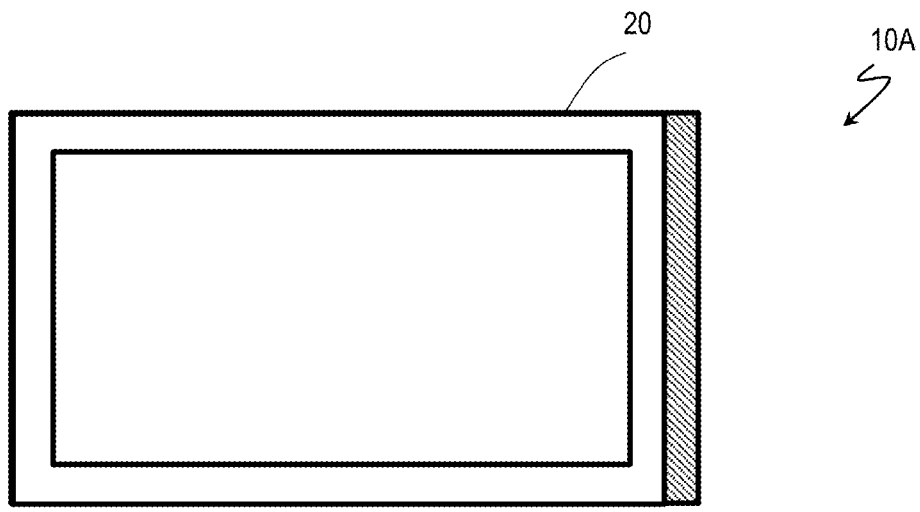
FIG. 2(a) and FIG. 2(b) are respectively schematic plan views of OLED display panels 10A and 10B provided by a method for producing the OLED display device in an embodiment according to the present invention.
Figure 2:
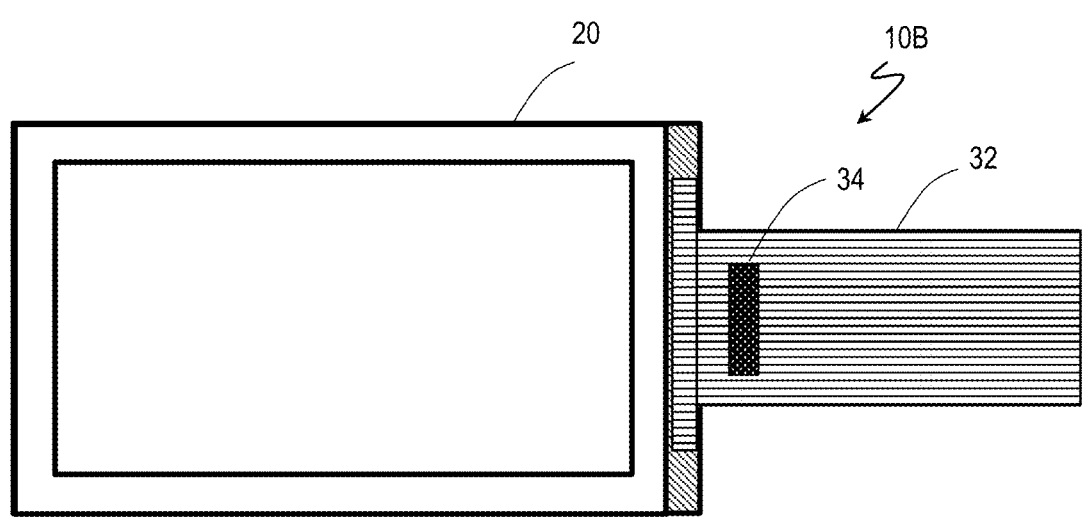

For example, as shown in FIG. 2(b), an FPC (Flexible Printed Circuits) 32 having a driver IC 34 mounted thereon may be connected with the OLED display panel 10A, so that an OLED display module 10B is provided. Needless to say, the driver IC may be directly mounted on the OLED display panel 10A. During a process for producing the OLED display panel portions 20, the driver IC may be formed monolithically. In this specification, the OLED display panel 10A and the OLED display module 10B will be collectively referred to as an "OLED display device". Needless to say, a final form including the OLED display module, a power source circuit, a control circuit and a housing will also be referred to as an "OLED display device".

Figure 3:
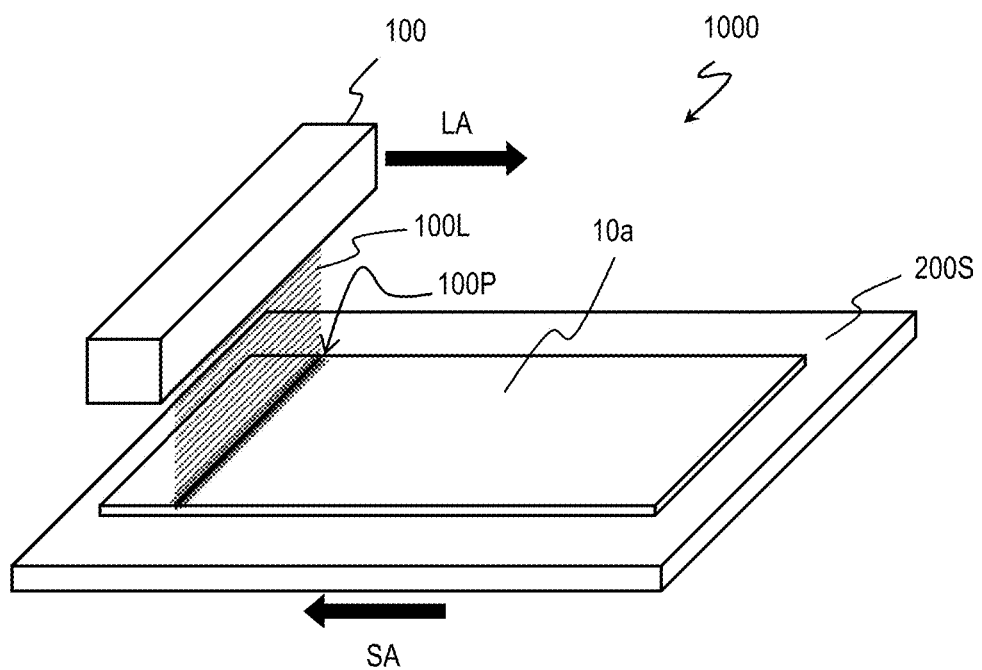
FIG. 3 is an isometric view schematically showing an example of structure of a line beam irradiation device 1000 usable to produce the OLED display device in an embodiment according to the present invention.

Now, with reference to FIG. 3, the LLO method will be described. FIG. 3 is an isometric view schematically showing an example of structure of a line beam irradiation device 1000 usable to produce an OLED display device in an embodiment according to the present invention.

The line beam irradiation device 1000 includes a stage 200S and a line beam light source (laser head) 100 irradiating the multi-portion panel substrate 10a located on the stage 200S with a line beam 100L.

The line beam irradiation device 1000 includes a transportation device (not shown) moving at least one of the stage 200S and the line beam light source 100, such that an irradiation position 100P, on the panel substrate 10a, irradiated with the line beam 100L is moved in a direction crossing the line beam 100L. Namely, the line beam light source 100 is moved in a direction represented by arrow LA, and/or the stage 200S is moved in a direction represented by arrow SA. The scanning rate of the line beam 100L on the panel substrate 10a is, for example, 1 cm/sec. to 20 cm/sec. (e.g., 16 cm/sec.). A commercially available example of the line beam light source 100 is an excimer laser which emits light having a wavelength of 308 nm, and with which the line beam 100L has a length of 750 mm, a width of 250 µm, and a laser energy density of 750 mJ/cm². Alternatively, a YAG laser (wavelength: 355 nm; line beam 100L: length: 200 mm, width: 20 µm, laser energy density: 210 mJ/cm²) is usable.

Figure 4:
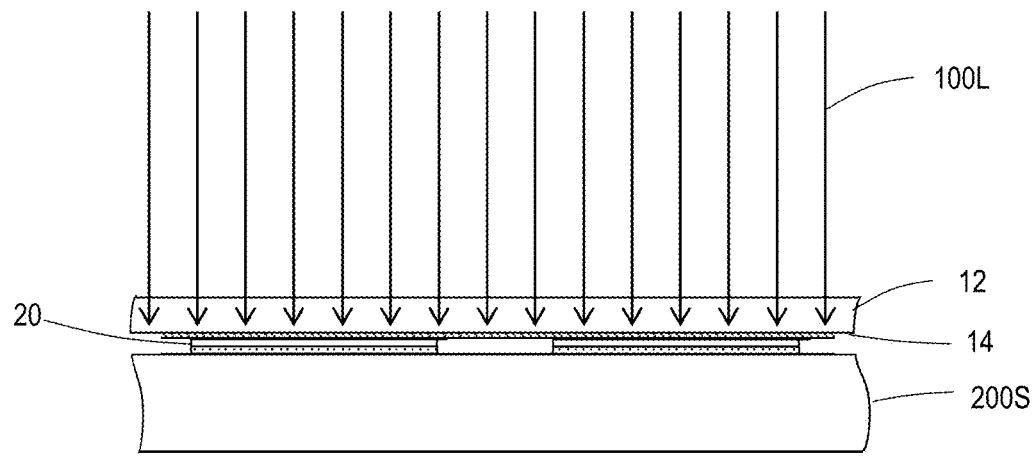
FIG. 4(a) is a cross-sectional view schematically showing a step of delaminating a polyimide film 14 from the panel substrate 10a by an LLO method by use of the line beam irradiation device 1000, and FIG. 4(b) schematically shows a flow of heat (dashed arrows) during the time duration when a line beam is directed.
Figure 4:
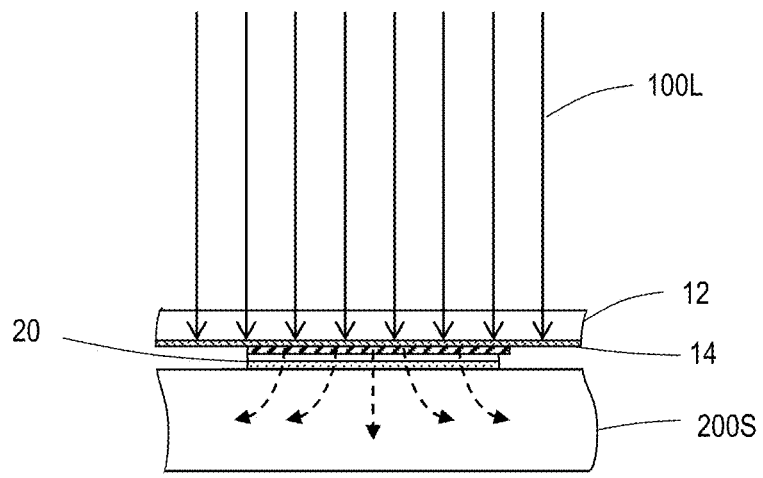

With reference to FIG. 4(a) and FIG. 4(b), problems solved by an embodiment according to the present invention will be described. FIG. 4(a) is a cross-sectional view schematically showing a step of delaminating the polyimide film 14 from the panel substrate 10a by the LLO method by use of the line beam irradiation device 1000. FIG. 4(b) schematically shows a flow of heat (dashed arrows) during the time duration when the line beam is directed. As described below by way of an example of experiment, the conventional method involves a problem that the polyimide film 14 is not delaminated uniformly in a region of the OLED display panel portions 20 of the panel substrate 10a and a region of gaps between the OLED display panel portions 20 (region of the panel substrate 10a where no OLED display panel portion is present).

Conventionally, as shown in FIG. 4(a), the polyimide film 14 is delaminated in a state where the OLED display panel portions 20 are in contact with the stage 200S of the line beam irradiation device 1000. The line beam 100L is directed toward the OLED display panel portions 20 of the panel substrate 10a and the gaps between the OLED display panel portions 20 (region of the panel substrate 10a where no OLED display panel portion 20 is present) at the same time. In this case, the line beam 100L is collected and directed toward the interface between the polyimide film 14 and the glass substrate 12 is absorbed by the polyimide film 14 to generate heat, and the generated heat rapidly raises the temperature of the polyimide film 14 in the vicinity of the interface. As a result, the polyimide in the vicinity of the interface is decomposed, and thus the polyimide film 14 is delaminated from the glass substrate 12.

At this point, as schematically shown in FIG. 4(b), a part of the heat generated at, and in the vicinity of, the interface is transmitted to the OLED display panel portions 20 and is further transmitted to the stage 200S (see the dashed lines in the figure). By contrast, in a region corresponding to the gaps between the OLED display panel portions 20, no OLED display panel portion 20 is present and only the polyimide film 14 is present (the barrier film or the like may be present, but in this example, it is assumed that only the polyimide film 14 is present for the sake of simplicity). Therefore, the heat generated at the interface of the polyimide film 14 is not easily released. As a result, the polyimide film 14 is less easily delaminated at a region of the interface corresponding to a rear surface (upper surface in the figures) of the OLED display panel portions 20, and is more easily delaminated at a region of the interface corresponding to the gaps between the OLED display panel portions 20. For this reason, when the line beam 100L having an energy density sufficient to appropriately delaminate the polyimide film 14 at the region of the interface corresponding to the rear surface of the OLED display panel portions 20 is directed, the polyimide film 14 is not delaminated at the region of the interface corresponding to the gaps between the OLED display panel portions 20. Oppositely, when the line beam 100L having an energy density sufficient to appropriately delaminate the polyimide film 14 at the region of the interface corresponding to the gaps between the OLED display panel portions 20 is directed, much ash (decomposed residuals of the polyimide) is generated on a region of a surface of the polyimide film 14 from which the glass substrate 12 has been delaminated, the region corresponding to the rear surface of the OLED display panel portions 20. In addition, the heat generation caused by the irradiation with the laser light having a high energy density may possibly cause a phenomenon that the light emission characteristics of the OLED display panel are deteriorated.

According to the method for producing an organic EL display device in an embodiment of the present invention, the glass substrate 12 is located above the stage 200S such that the OLED display panel portions 20 face the stage 200S. In this state, a step (LLO step) of directing the line beam 100L in a direction from the glass substrate 12 toward at least the interface between the polyimide film 14 and the glass substrate 12 while moving the line beam 100L and the glass substrate 12 with respect to each other is performed. In this step, the heat releasing rate from the interface between the polyimide film 14 and the glass substrate 12 toward the OLED display panel portions 20, and the heat releasing rate from the interface between the polyimide film 14 and the glass substrate 12 toward the gaps between the OLED display panel portions 20, are made substantially equal to each other. Whether the heat releasing rates are substantially equal to each other or not may be determined based on whether or not a good delamination state is provided by the irradiation with the same light beam 100L. The "good delamination state" refers to that the polyimide film 14 is not left on the glass substrate 12 and the amount of ash generation is sufficiently small. Specific examples of how to determine whether the delamination state is good or not will be described below by way of examples of experiment. A rise in the temperature by the irradiation with the line beam 100L occurs in a very short time duration. Therefore, it is difficult to find the heat releasing rate by actually measuring a temperature change or the like.

Figure 5:
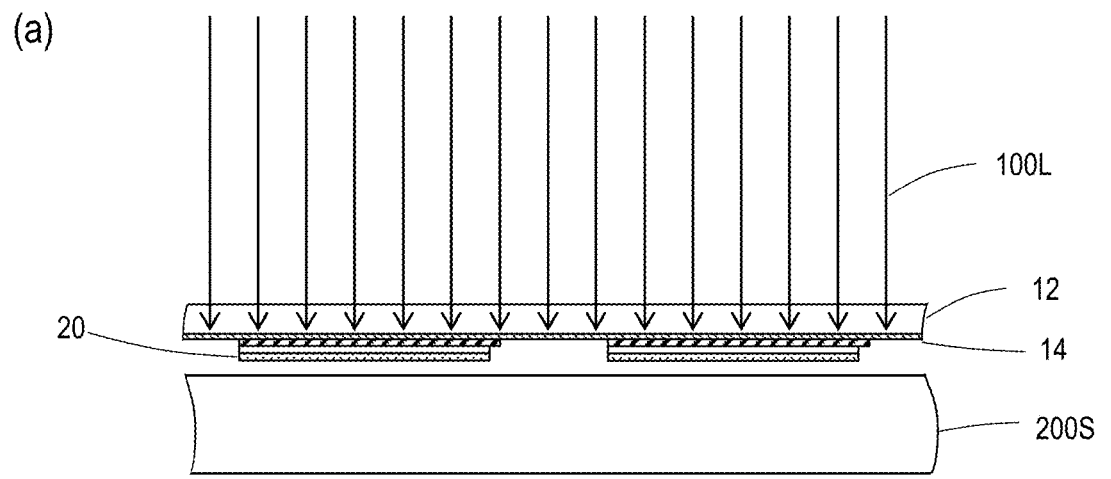
FIG. 5(a) and FIG. 5(b) are each a schematic view showing an LLO step in the method for producing the OLED display device in an embodiment according to the present invention.
Figure 5:
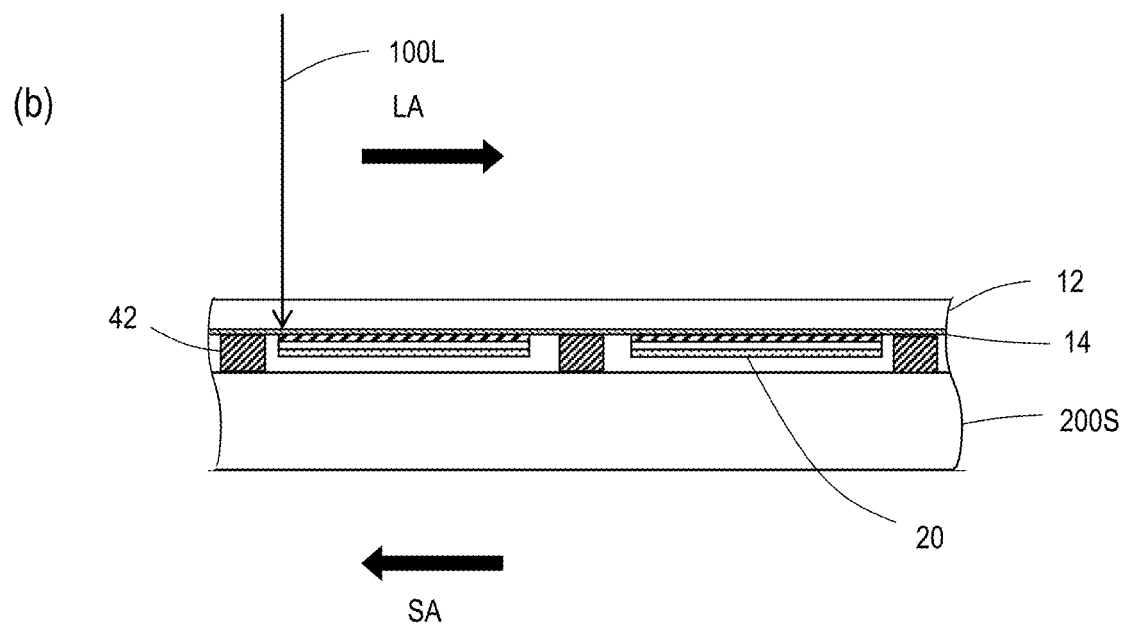

The above-described LLO step is performed in a state where, for example, the OLED display panel portions 20 are substantially thermally insulated from the stage 200S. Specifically, as schematically shown in FIG. 5(a) and FIG. 5(b), the above-described LLO step is performed in a state where the OLED display panel portions 20 are out of contact with the stage 200S. In this case, the OLED display panel portions 20 and the stage 200S are thermally insulated from each other by air (atmospheric air) present in a gap between the OLED display panel portions 20 and the stage 200S. A member having a low thermal conductivity may be located in the gap. Such a member having a low thermal conductivity may be formed of, for example, a plastic material. It is preferred that the thermal conductivity is, for example. 0.2 W/m·K or lower. The member having a low thermal conductivity may be formed of a foamed plastic material. Alternatively, in a state where the OLED display panel portions 20 are in contact with the stage 200S, the stage 200S may be heated to suppress the heat release from the OLED display panel portions 20.

FIG. 5(a) and FIG. 5(b) show an example in which the line beam 100L along the longer side (side extending in the row direction) of the panel substrate 10a shown in FIG. 1(a) is relatively moved (scanned) in a direction parallel to the shorter side (side extending in the column direction). As shown in FIG. 5(b), spacer members 42 extending in the row direction are located between the OLED display panel portions 20 adjacent to each other in the column direction to realize a state where the OLED display panel portions 20 are out of contact with the stage 200S. The spacer members 42 may be formed of a material having a relatively high thermal conductivity (e.g., glass or a metal material (e.g., stainless steel or aluminum)).

Figure 6:
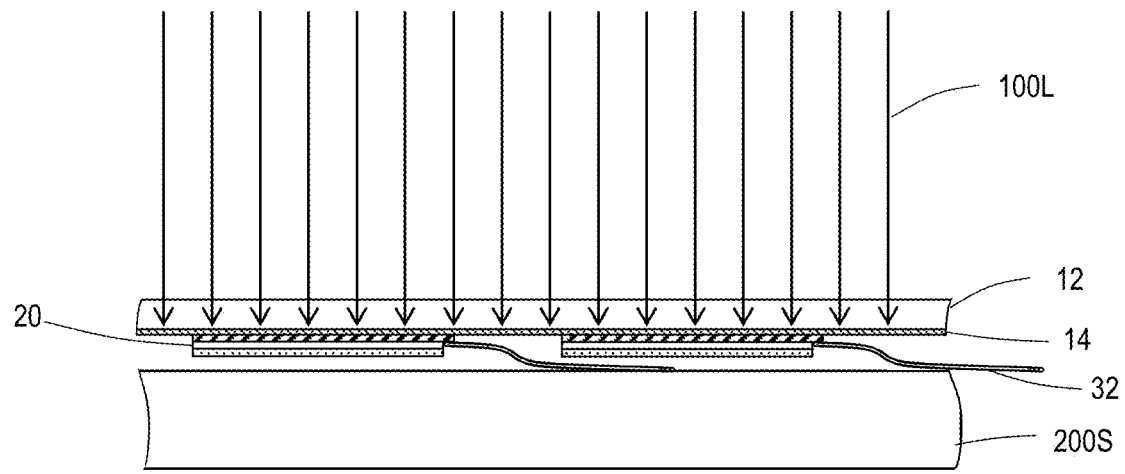
FIG. 6 is a schematic view showing another LLO step in the method for producing the OLED display device in an embodiment according to the present invention.

As described above, a structure, in which the spacer members 42 extending in the row direction are provided between the OLED display panel portions 20 adjacent to each other in the column direction whereas no spacer member 20 is provided between the OLED display panel portions 20 adjacent to each other in the row direction, may be adopted. In this case, as schematically shown in, for example, FIG. 6, the LLO step may be performed after the FPC 32 is mounted on each of the OLED display panel portions 20. In this case, as shown in FIG. 6, the FPC 32 of a certain OLED display panel portion 20 may be located below the OLED display panel portion 20 adjacent to the certain OLED display panel portion 20 in the row direction. Therefore, the pitch, in the row direction, between the OLED display panel portions 20 does not need to be unnecessarily long.

The spacer members 42 may be modified to any of various forms. A spacer member may be, for example, like a plate that has an opening at a position corresponding to the OLED display panel portion 20 and is thicker than the OLED display panel portion 20 (see, for example, FIG. 10). Alternatively, a spacer member having walls arrayed in a lattice may be used in a state where the walls are in the gaps between the OLED display panel portions 20 arrayed in a matrix. Still alternatively, spacer members may be discretely located.

Now, an example of experiment will be described.

For the LLO step, an excimer laser that emits light having a wavelength of 308 nm (C300 produced by Japan Steel Works Ltd.) was used. The pulse conditions of the excimer laser were as follows.

Oscillation frequency: 300 Hz
Area size of the region irradiated with the laser light: 750 mm×345 μm (25.9 cm$^2$)
Maximum energy density: 235 mJ/cm$^2$
Overlap ratio: 50%

The stage 200S was formed of stainless steel and had a feeding rate of 5.175 cm/sec.

As a sample to be used as the above-described panel substrate, an assembly of a glass substrate and a PET film as a sealing film was used.

As the glass substrate, AN100 produced by AGC (thickness: 0.5 mm; 33 mm×33 mm) was used.

As the polyimide, a highly heat-resistant varnish material (polyimide precursor solution U-varnish-S produced by Ube Industries, Ltd. (solvent: NMP (N-methyl-2-pyrrolidone); solid content: 18% by mass)) was used. The polyimide was formed into a film by use of a slot coater so as to have a post-sintering thickness of 15 μm. The sintering was performed at 400° C. to 500° C. for 0.1 to 1 hour by use of a heat wave circulation-type sintering oven.

Instead of the sealing film, PET (A4100 produced by Toyobo Co., Ltd.; thickness: 0.1 mm) was used.

Figure 7:
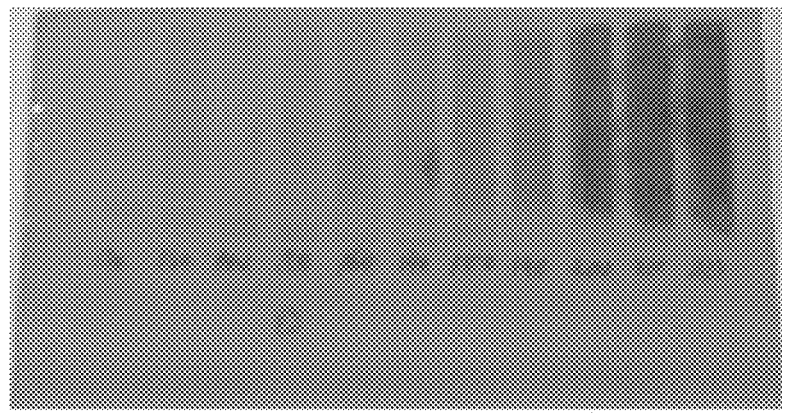
FIG. 7 shows an optical image of a polyimide film after the polyimide film is irradiated with laser light having different energy densities.

First, with reference to FIG. 7, results of examination on the energy density optimal to delaminate the polyimide film from the glass substrate will be described. FIG. 7 shows an optical image of a polyimide film after the polyimide film was irradiated with laser light having different energy densities by use of the above-described excimer laser. The energy densities were, from the left, 120 mJ/cm$^2$, 130 mJ/cm$^2$, 140 mJ/cm$^2$, 150 mJ/cm$^2$, 160 mJ/cm$^2$, 170 mJ/cm$^2$, 180 mJ/cm$^2$, 190 mJ/cm$^2$, 200 mJ/cm$^2$, 210 mJ/cm$^2$ and 220 mJ/cm$^2$. The energy density was adjusted by an attenuator. The energy density when the attenuation provided by the attenuator was zero was the maximum energy density described above.

When the energy density was 140 mJ/cm$^2$ or lower, the polyimide film was not delaminated. When the energy density was 150 mJ/cm$^2$ or higher, the polyimide film was delaminated uniformly. When the energy density was 170 mJ/cm² or higher, the amount of ash generation was increased along with the increase in the energy density. In the optical image shown in FIG. 7, some regions irradiated with the laser light were darkened because of the ash generation. Especially when the energy density was 200 mJ/cm² or higher, the amount of ash generation was extremely large. As can be seen from this, as long as the energy density is controlled to be in an appropriate range, the polyimide film is uniformly delaminated and the amount of ash generation is suppressed to be sufficiently small. In the case where the amount of ash generation is large, a washing step of removing the ash is time-consuming, which extends the tact time.

Figure 8:
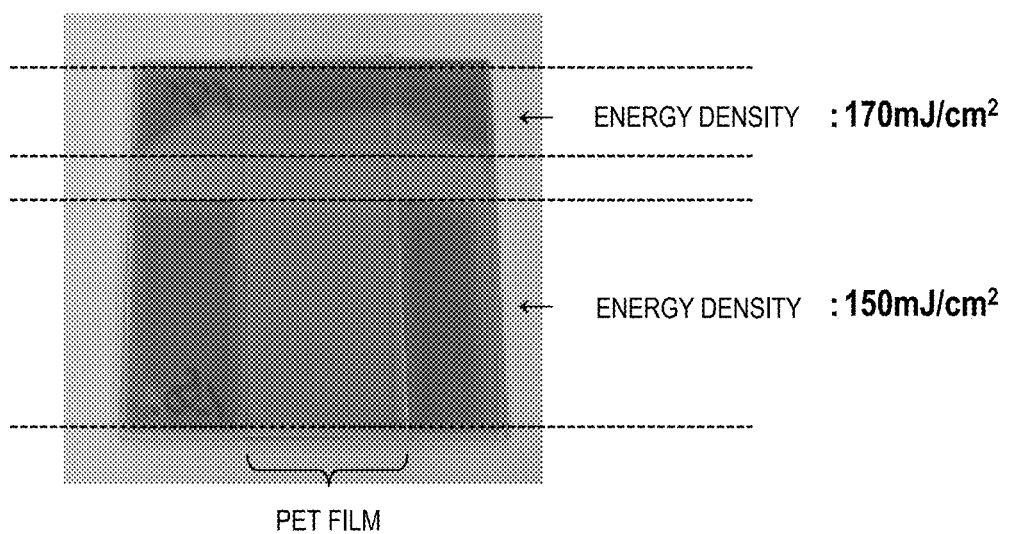
FIG. 8 shows an optical image of a polyimide film after the polyimide image is irradiated with laser light (the energy density is increased from 150 mJ/cm$^2$ to 170 mJ/cm$^2$).

Next, a PET film was bonded, with an adhesive, to a central region, of a polyimide film, in a width direction of a glass substrate, so that a sample to be used as the OLED display panel portion 20 was produced. The sample was irradiated with laser light. The sample was located such that the PET film would be in contact with the stage. The energy density at the start of irradiation was 150 mJ/cm². After the irradiation was paused for a short time duration, the energy density was increased to 170 mJ/cm². FIG. 8 shows an optical image of the polyimide film after the polyimide film was irradiated with laser light.

It has been found from the results shown in FIG. 8 that at the energy density of 150 mJ/cm², a region of the polyimide film to which the PET film was bonded (region used as the OLED display panel portion) is not delaminated. In the region of the polyimide film that was delaminated at the energy density of 150 mJ/cm², the amount of ash generation was larger than in the case shown in FIG. 7 (fourth from the left). When the energy density was increased from 150 mJ/cm² to 170 mJ/cm², a part of the polyimide film was not delaminated immediately after the increase, but after that, the entirety of the polyimide film, including the region to which the PET film was bonded, was delaminated. It was considered from these results of the experiment that it was the mechanism described above with reference to FIG. 4 that caused a delamination defect.

The sample in which the PET film was bonded to the central region, of the polyimide film, in the width direction of the glass substrate was used to evaluate whether the polyimide film was delaminated or not and also evaluate the amount of ash generation, while the energy density was varied. Table 1 shows the results. Regarding the evaluation results on the degree at which the polyimide film was delaminated, × indicates that there was a region that was not delaminated, Δ indicates that there was a portion (point) that was not delaminated, and ○ indicates that the entirety of the polyimide film was delaminated completely. The degree of the amount of ash generation was evaluated by the amount of ash attached to a piece of gauze used to wipe off the ash. Regarding the evaluation results on the amount of ash generation, × indicates that the brown ash was wiped out easily, Δ indicates that the brown ash was attached to the gauze in a very thin state, and ○ indicates that the color of the gauze was not changed.

In the example, a spacer member 42A shown in FIG. 10(a) and FIG. 10(b) was used as the spacer member supporting the PET film as being out of contact with the stage. The spacer member 42A was formed of an aluminum plate having a thickness of 3 mm (the surface was anodized) and had an opening 42a. The spacer member 42A supported the sample by a stepped portion 42s inner to the opening 42a.

TABLE 1

| | Item to evaluate | Energy density (mJ/cm²) | | | Remarks |
| --- | --- | --- | --- | --- | --- |
| | | 150 | 170 | 190 | |
| Comparative example | Delamination | × | Δ | ○ | High energy density is needed for delamination. |
| | Ash amount | — | Δ | × | Large amount of ash is generated under the delamination conditions. |
| Example | Delamination | Δ | ○ | ○ | Delamination is possible at a low energy density of 170 mJ/cm². |
| | Ash amount | ○ | ○ | × | The amount of ash is small at the time of delamination. |

As can be seen from the results shown in Table 1, with the above-described sample, when the energy density is 170 mJ/cm², the entirety of the polyimide film, including the region where the PET film is bonded, is delaminated, and the amount of ash generation is suppressed to be small. Needless to say, the optimal energy density varies in accordance with the structure or the size of the panel substrate to be delaminated. Nonetheless, there is an optimal energy density at which the entirety of the polyimide film, including regions corresponding to the OLED display panel portions, is delaminated, and the amount of ash generation is suppressed to be small.

Figure 9:
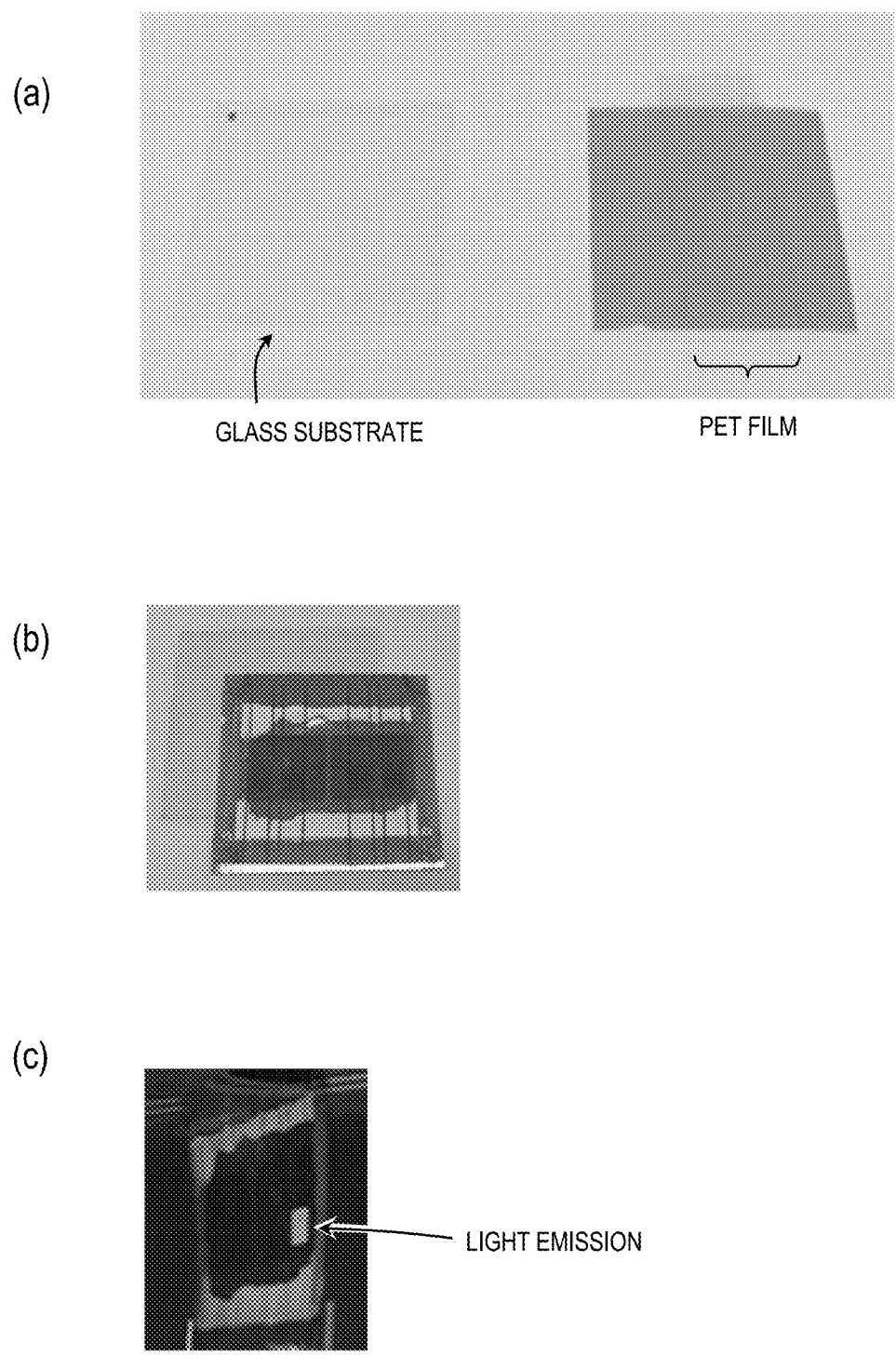
FIG. 9(a) shows an optical image of a glass substrate from which a polyimide film has been delaminated under the condition of an energy density of 170 mJ/cm$^2$ (left) and an optical image of the polyimide film to which a PET film is bonded (right)
FIG. 9(b) shows an optical image of an OLED display panel, produced as a trial product, that has been delaminated from a glass substrate (left)
FIG. 9(c) shows an optical image showing a light emission state of the OLED display panel produced as the trial product.

FIG. 9(a) shows an optical image of the glass substrate from which the polyimide film has been delaminated under the condition of an energy density of 170 mJ/cm² (left), and also shows an optical image of the polyimide film to which the PET is bonded (right), in the above-described example. As is clear from FIG. 9(a), the entirety of the polyimide film was completely delaminated from the glass substrate, and the amount of ash generation was small.

OLED display panel portions were produced on the polyimide film, and a sealing PET film (barrier film) was bonded thereto to produce a sample. The sample was used to perform a similar experiment. As shown in FIG. 9(b), the amount of ash generation was small and the polyimide film was delaminated uniformly, like in FIG. 9(a). As shown in FIG. 9(c), the OLED display panel delaminated from the glass substrate emitted light with no problem, no damage by the delamination was exhibited, and a good emission state was confirmed.

Figure 10:
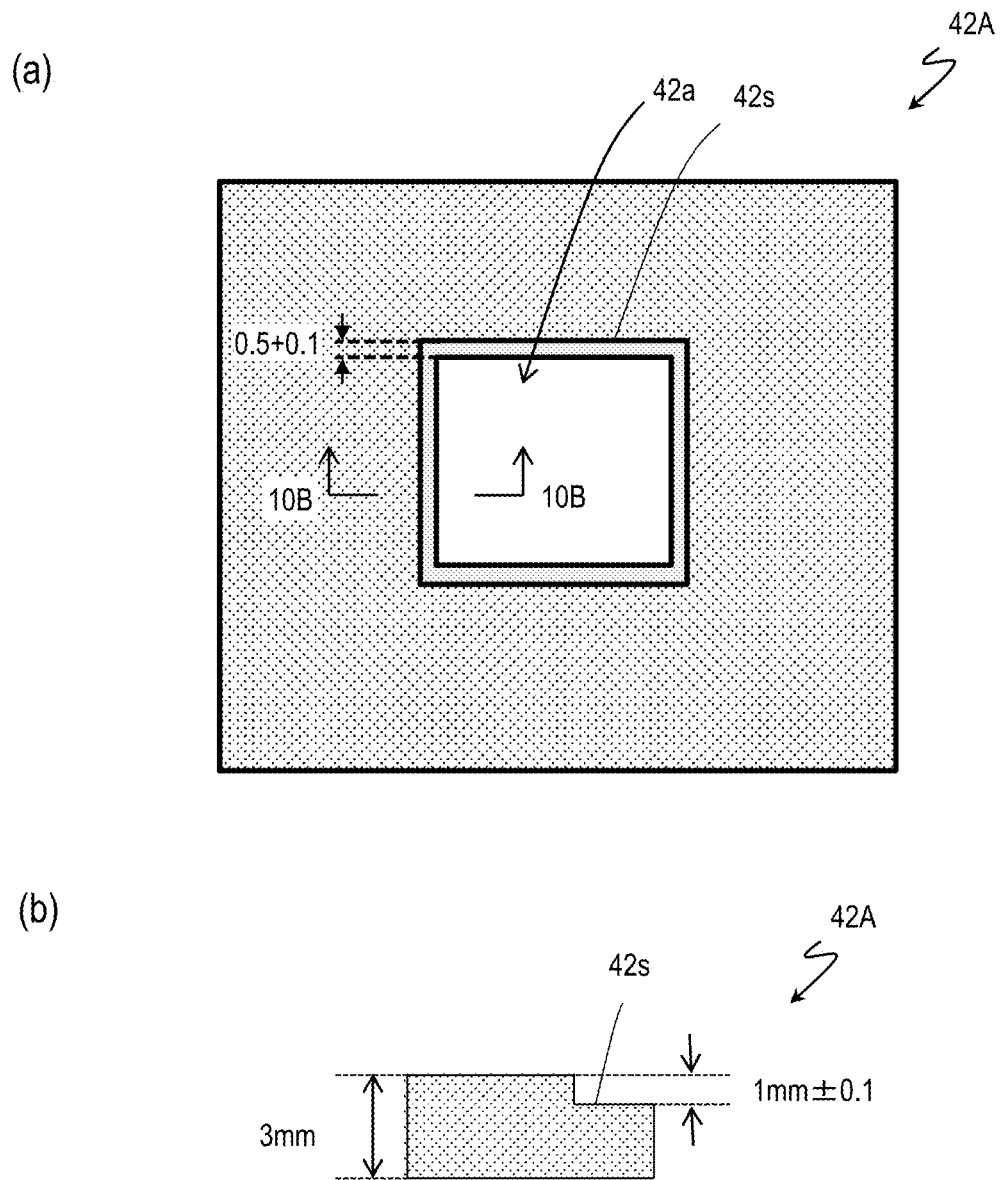
FIG. 10(a) and FIG. 10(b) are schematic views showing a spacer member 42A.
Figure 11:
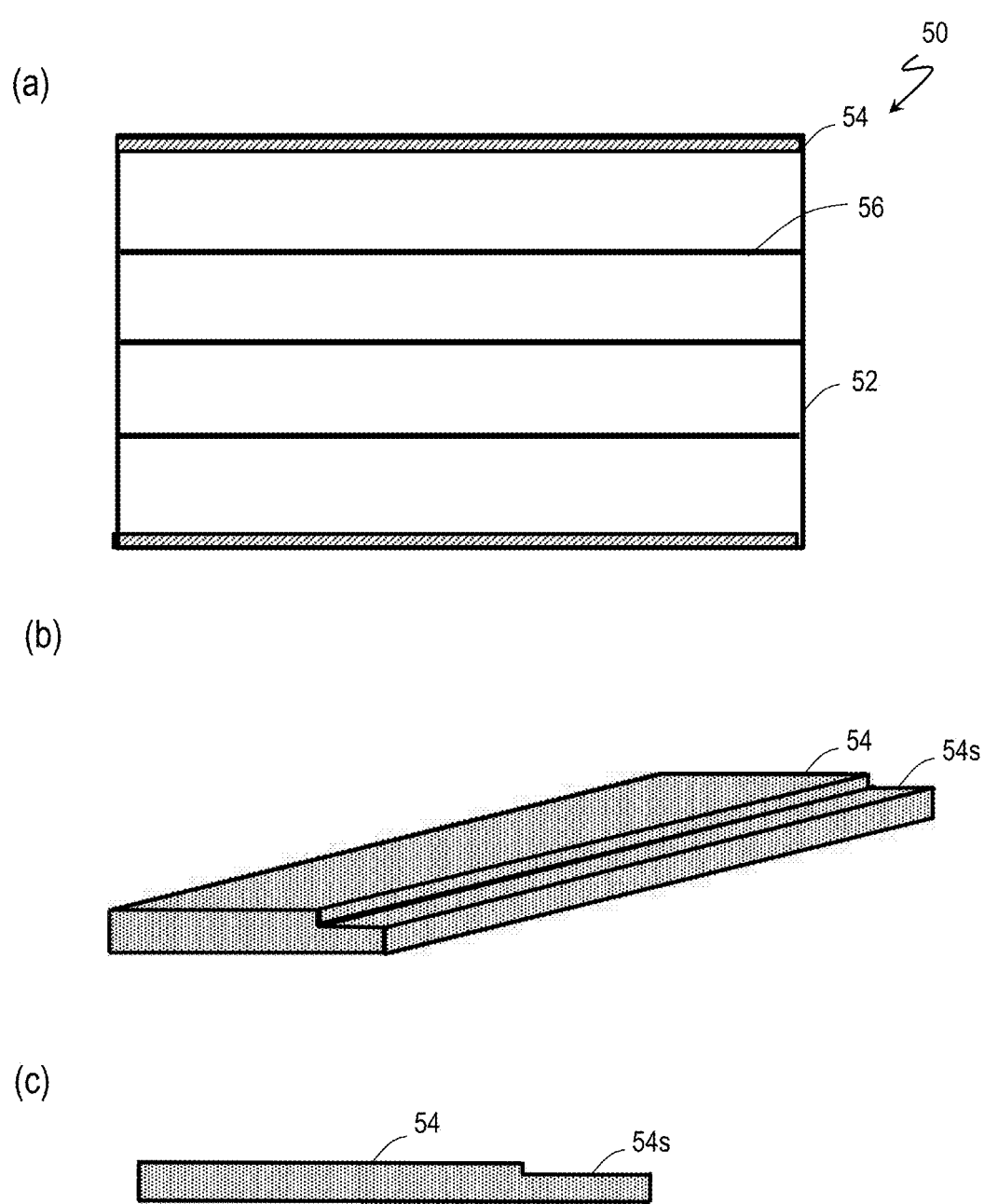
FIG. 11(a) through FIG. 11(c) are provided to illustrate a spacer member 50.
Figure 12:
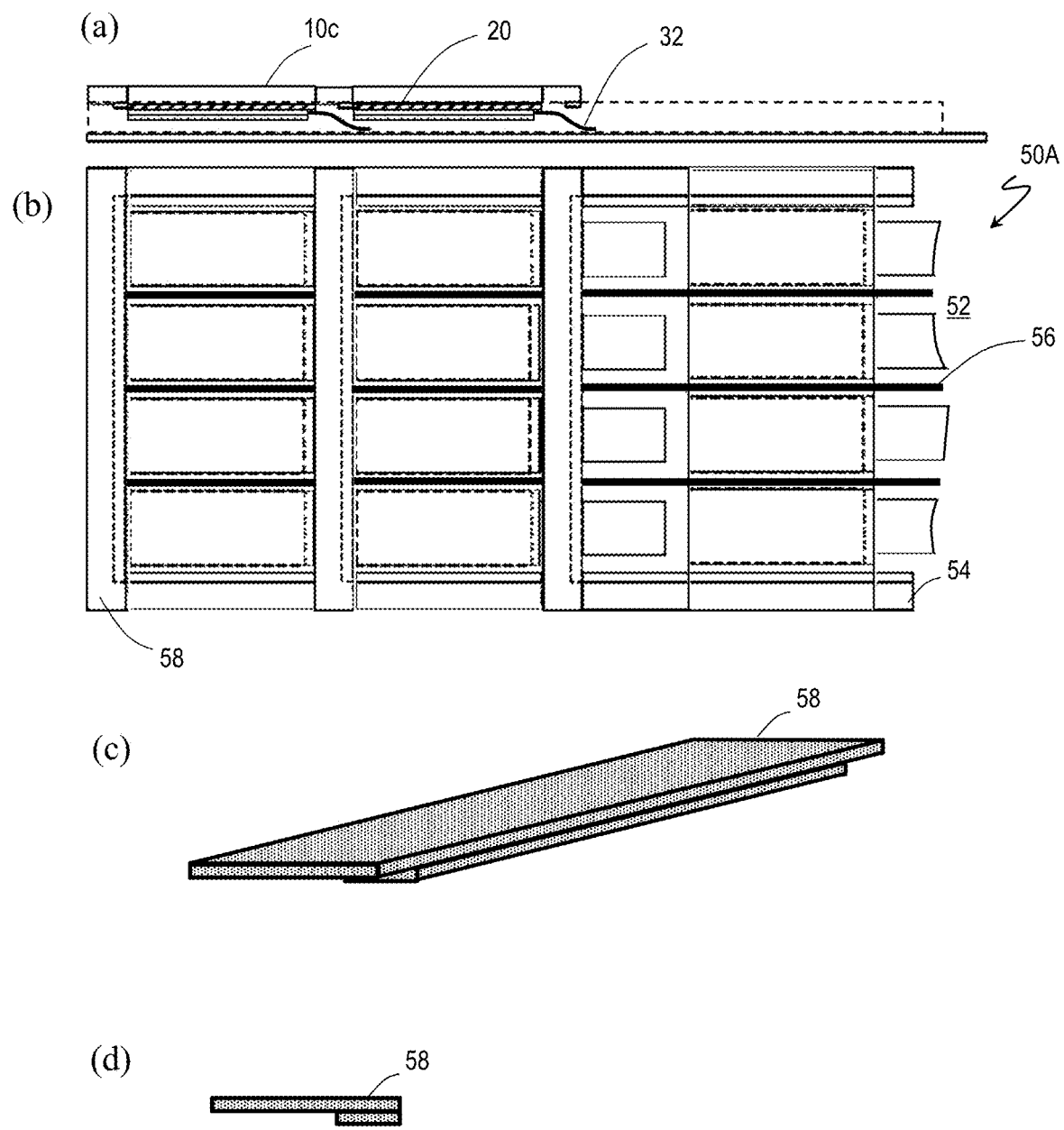
FIG. 12(a) through FIG. 12(d) are provided to illustrate a spacer member 50A.
Figure 13:
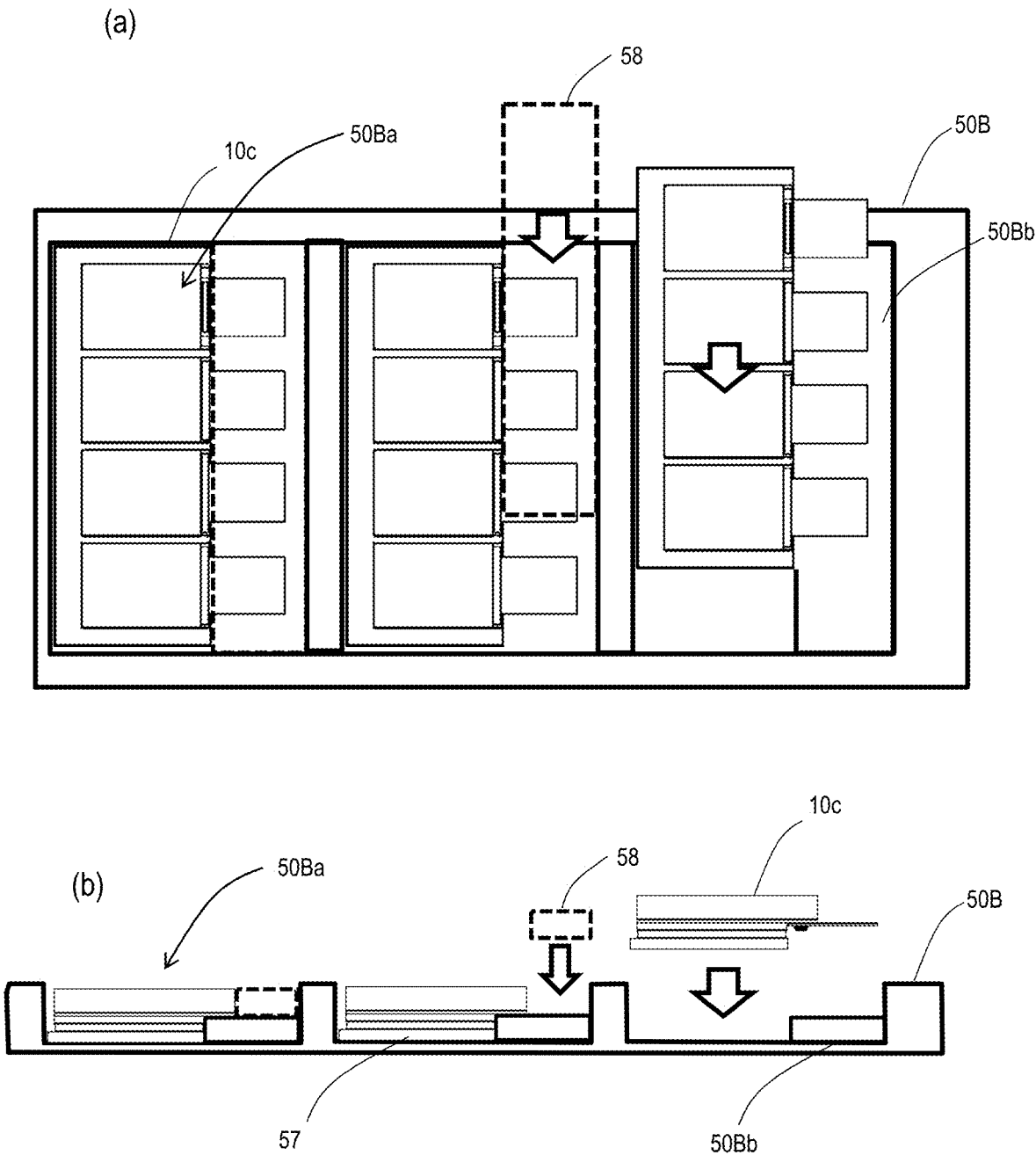
FIG. 13(a) and FIG. 13(b) are provided to illustrate a spacer member 50B.

The spacer member 42A shown in FIG. 10 was formed of a glass plate, instead of the aluminum plate, and the resultant spacer member was used to perform a similar delamination experiment. The results were good as in FIG. 9.

Hereinafter, with reference to FIG. 11 through FIG. 14, examples of the spacer member will be described. The spacer member does not need to be a single member as described above, and may include a plurality of members. For example, the spacer member may include a tray.

With reference to FIG. 11(a) through FIG. 11(c), a structure and a form of use of a spacer member 50 will be described. The spacer member 50 is usable in, for example, the step of delaminating the panel substrate 10a shown in FIG. 1(a).

As shown in FIG. 11(a), the spacer member 50 includes a substrate 52 (e.g., 375×620×0.5 mm), two first spacers 54 (e.g., 620×20×2 mm) located along the longer side (end side) of the substrate 52, and three second spacers 56 (e.g., 620×3×1.5 mm) extending parallel to the first spacers 54. The substrate 52 is, for example, a glass substrate or an aluminum substrate. The first spacers 54 and the second spacers 56 are formed of, for example, aluminum (the surfaces are anodized).

As shown in FIG. 11(b), the first spacers 54 each have a shape thereof processed to have a stepped portion 54s such that a panel substrate is placed thereon. The first spacers 54 each support the panel substrate by the stepped portion 54s, and also prevent the panel substrate from being positionally shifted in a lateral direction. The second spacers 56 prevent the panel substrate from being slacked downward by the weight of the panel substrate itself and keep horizontal the height of the interface of the panel substrate to be irradiated with the laser light. The number of the second spacers 56 may be appropriately changed when necessary. The height of the second spacers 56 is set to be equal to the height of the stepped portions 54s of the first spacers 54, so that the panel substrate has a constant height from the stage. For example, where the height of the first spacers 54 is 2 mm and the thickness of the panel substrate is 0.5 mm, the height of the stepped portions 54s needs to be 1.5 mm in order to match the height of the first spacers 54 to the height of the panel substrate. In this case, the height of the second spacers 56 is 1.5 mm.

In the above, an example in which the panel substrate including the OLED display panel portions 20 arrayed in a matrix is delaminated is described. Alternatively, as shown in, for example, FIG. 12, a plurality of panel substrates 10c each including a plurality of OLED display panel portions 20 arrayed in one line may be delaminated at the same time.

The panel substrates 10c each have the FPC 32 mounted for each of the OLED display panel portions 20. The FPCs 32 may be mounted on the panel display 10c including the plurality of OLED display panel portions 20, so that the throughput is improved as compared with in the case where the FPCs 32 are mounted individually after the OLED display panel portions 20 are delaminated from the glass substrate.

With reference to FIG. 12(a) through FIG. 12(d), a structure and a form of use of a spacer member 50A will be described.

As shown in FIG. 12(b), the spacer member 50A includes a substrate 52, first spacers 54 and second spacers 56, like the spacer member 50 shown in FIG. 11(a). One panel substrates 10c is located for one column of the spacer member 50A. An FPC protective member 58 shown in FIG. 12(b) and FIG. 12(c) is located between each two panel substrates 10c adjacent to each other and also at each of two ends of the spacer member 50A. The FPC protective member 58 protects the FPC against the laser light and also adjusts the relative positions of the panel substrates 10c.

With reference to FIG. 13(a) and FIG. 13(b), a structure and a form of use of a spacer member 50B will be described.

The spacer member 50B is tray-shaped and includes a plurality of cavities 50Ba each receiving a panel substrate 10c. As shown in FIG. 13(b), one panel substrate 10c is located in one cavity 50Ba. When necessary, a third spacer 50Bb is located. Needless to say, the third spacer 50Bb may be integrally formed with the spacer member 50B. A support plate 57 may be located below each of the panel substrates 10c. The spacer member 50B, the third spacer 50Bb and the support plate 57 are formed of a material having a low thermal conductivity, for example, a plastic material.

The spacer member 50B accommodating the panel substrates 10c in the cavities 50Ba is located on the stage. In the case where the spacer member 50B is used, the OLED display panel portions 20 included in each of the panel substrates 10c are in contact with the stage via the spacer member 50B, the third spacer 50Bb and the support plate 57, unlike in the above-described examples. However, the spacer member 50B, the third spacer 50Bb and the support plate 57 are all formed of a material having a low thermal conductivity (e.g., thermal conductivity of 0.2 W/m·K or less). Therefore, substantially the same effect is provided as in the case where a gap is provided between the OLED display panel portions 20 and the stage.

The LLO step in the method for producing an organic EL display device in an embodiment according to the present invention may use any of various types of spacer members instead of the spacer members described above as examples.

Figure 14:
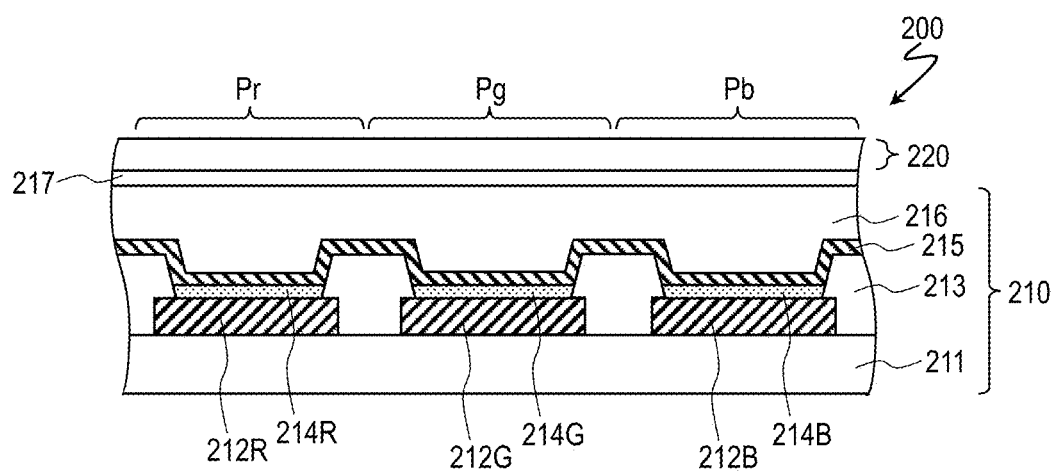
FIG. 14 is a cross-sectional view schematically showing a top emission-type OLED display panel 200.

An organic EL display device produced by a production method in an embodiment according to the present invention may be, for example, a top emission-type OLED display panel 200 shown in FIG. 14. Namely, the OLED display panel portion 20 in the above-described embodiment may have the same structure as that of the OLED display panel 200 shown in FIG. 14.

FIG. 14 is a cross-sectional view schematically showing the top emission-type OLED display panel 200.

As shown in FIG. 14, the OLED display panel 200 includes an active matrix substrate (TFT substrate) 210 and a sealing film 220, and includes a red pixel Pr, a green pixel Pg and a blue pixel Pb.

The TFT substrate 210 includes an insulating substrate and a TFT circuit formed on the insulating substrate (neither is shown). A flattening film 211 is provided in order to prevent an influence of concaved and convexed portion of the substrate at the time of formation of the TFT circuit. The flattening film 211 is formed of an organic insulating material.

Lower electrodes 212R, 212G and 212B are provided on the flattening film 211. The lower electrodes 212R, 212G and 212B are respectively formed in the red pixel Pr, the green pixel Pg and the blue pixel Pb. The lower electrodes 212R, 212G and 212B are connected with the TFT circuit and each act as an anode. Banks 213 covering ends of the lower electrode 212R, 212G and 212B are provided between pixels adjacent to each other. The banks 213 are formed of an insulating material.

Organic EL layers 214R, 214G and 214B are respectively provided on the lower electrodes 212R, 212G and 212B in the red pixel Pr, the green pixel Pg and the blue pixel Pb. The organic EL layers 214R, 214G and 214B each include a stack structure that includes a plurality of layers formed of an organic semiconductor material. The stack structure includes, for example, a hole injection layer, a hole transfer layer, a light emission layer, an electron transfer layer and an electron injection layer in this order from the side closer to the lower electrodes 212R, 212G or 212B. The organic EL layer 214R in the red pixel Pr includes a light emission layer that emits red light. The organic EL layer 214G in the green pixel Pg includes a light emission layer that emits green light. The organic EL layer 214B in the blue pixel Pb includes a light emission layer that emits blue light.

An upper electrode 215 is provided on the organic EL layers 214R, 214G and 214B. The upper electrode 215 is formed of a transparent conductive material and is provided continuously over the entirety of a display region (namely, provided commonly to the red pixel Pr, the green pixel Pg and the blue pixel Pb), and acts as a cathode. A sealing layer 216 is provided on the upper electrode 215. The sealing layer 216 is formed of an inorganic material or an organic material, or may include an insulating stack structure of the insulating material and the organic material.

The above-described elements of the TFT substrate 210 are sealed by a sealing film 220 bonded to the TFT substrate 210 with a transparent resin layer 217.

An organic EL display device produced by a production method in an embodiment according to the present invention is not limited to any of the above-described examples, and may be any of known organic EL display devices. For example, a bottom emission-type organic EL display device may be produced. In this case, it is preferred that the heat-resistant polymer film 14 is transparent with respect to visible light and is formed of transparent polyimide. An organic EL display device produced by a production method in an embodiment according to the present invention is not limited to including three independent pixels (OLEDs). For example, an organic EL display device that emits white light and outputs different colors of light by use of a color filter may be produced.

INDUSTRIAL APPLICABILITY

The present invention is usable for a method for producing an organic EL display device, specifically, a flexible organic EL display device.

REFERENCE SIGNS LIST 10a, 10b, 10c panel substrate
12 support substrate (glass substrate)
14 heat-resistant polymer film (polyimide film)
20 OLED display panel portion
22 element layer
24 barrier layer
26 sealing film
32 FPC
34 driver IC
42 spacer member
42a opening
42s stepped portion
50 spacer member
100 line beam light source
100L line beam
100P irradiation position
200 OLED display panel
200S stage
1000 line beam irradiation device

The invention claimed is:

1. A method for producing an organic Electro-Luminescence (EL) display device, comprising:
    forming a polymer film on a support substrate;
    forming a plurality of organic EL display panel portions on the polymer film; and
    positioning the support substrate with the plurality of organic EL display panel portions on a stage and arranging the plurality of organic EL display panel portions on the support substrate to face the stage; maintaining a distance between the plurality of organic EL display panel portions and the stage by a spacer member inserted between the stage and a region in the support substrate, the spacer member being spaced apart from the plurality of organic EL display panel portions; and
    directing a line beam in a direction from the support substrate toward at least an interface between the polymer film and the support substrate while moving the line beam and the stage with respect to each other; wherein the line beam is moved in a first direction, and the stage is moved in a second direction opposite to the first direction; the spacer member defines an opening and comprises a stepped portion surrounding the opening.

2. The method for producing an organic EL display device of claim 1, wherein forming the plurality of organic EL display panel portions comprises forming the plurality of organic EL display panel portions arrayed in at least one line.

3. The method for producing an organic EL display device of claim 2, wherein the method further comprises mounting a driving circuit on the plurality of organic EL display panel portions arrayed in the at least one line before positioning the support substrate with the plurality of organic EL display panel portions on the stage.

4. The method for producing an organic EL display device of claim 1, wherein the spacer member is made of glass or aluminum.

* * * * *